(12) United States Patent
Choi et al.

(10) Patent No.: US 7,692,918 B2
(45) Date of Patent: Apr. 6, 2010

(54) COUPLING STRUCTURE OF CHASSIS BASE AND CIRCUIT BOARD AND DISPLAY APPARATUS INCLUDING THE SAME

(75) Inventors: Hak-Ki Choi, Suwon-si (KR); Sam-Ju Choi, Suwon-si (KR); Meen-Suk Kim, Suwon-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 85 days.

(21) Appl. No.: 11/984,266

(22) Filed: Nov. 15, 2007

(65) Prior Publication Data

US 2008/0212270 A1 Sep. 4, 2008

(30) Foreign Application Priority Data

Mar. 2, 2007 (KR) .................. 10-2007-0021156

(51) Int. Cl.
 *G06F 1/16* (2006.01)
(52) U.S. Cl. .............. 361/679.21; 257/686; 174/74; 206/721; 381/361
(58) Field of Classification Search .......... 361/818, 361/689.01, 679.02, 679.34, 679.56; 257/686; 174/35 R, 74; 206/719–721; 381/361
See application file for complete search history.

(56) References Cited

U.S. PATENT DOCUMENTS

| 6,426,457 B1 * | 7/2002 | Toyoda et al. ............... 174/377 |
| 2005/0162842 A1 | 7/2005 | Muramatsu et al. |
| 2006/0109639 A1 * | 5/2006 | Nakano ..................... 361/818 |
| 2007/0273014 A1 * | 11/2007 | Lee et al. .................... 257/686 |

FOREIGN PATENT DOCUMENTS

| KR | 10-2001-0011285 A | 2/2001 |
| KR | 10-2003-0076470 A | 9/2003 |
| KR | 10-2004-0011174 A | 2/2004 |
| KR | 10-2005-0073407 A | 7/2005 |

\* cited by examiner

*Primary Examiner*—Hung V Duong
(74) *Attorney, Agent, or Firm*—Lee & Morse P.C.

(57) ABSTRACT

Example embodiments relate to a coupling structure including a chassis base configured to support a display panel, and an electromagnetic wave shielding member connected to the chassis base so as to form an area for installing a circuit board. The electromagnetic wave shielding member may surround the circuit board.

20 Claims, 4 Drawing Sheets

COUPLING STRUCTURE OF CHASSIS BASE AND CIRCUIT BOARD AND DISPLAY APPARATUS INCLUDING THE SAME

BACKGROUND OF THE INVENTION

1. Field of the Invention

Example embodiments relate to a coupling structure of a chassis base and a circuit board, and a display apparatus including the same.

2. Description of the Related Art

In the field of display technology, there may be various types of display apparatuses, i.e., plasma display panels (PDPs), thin film transistor-liquid crystal displays (TFT-LCDs), organic light emitting diode (OLEDs) displays, field emission displays (FEDs), and surface-conduction electron-emitter displays (SEDs). A flat panel display apparatus using a PDP may display images using a gas discharge, and may exhibit desirable properties, e.g., high image quality, slim structure, light weight, wide viewing angle, and large screen size. In addition, a plasma display apparatus may be easily fabricated and easily enlarged. Therefore, a plasma display apparatus may be particularly suitable for large flat panel displays.

A plasma display apparatus may include a PDP, a chassis disposed parallel to the PDP, one or more circuit boards disposed on a rear portion of the chassis to drive the PDP, and a case to enclose the PDP, the chassis and the circuit boards. Further, various types of circuit boards, for example, an address electrode driving circuit board, an X electrode driving circuit board, a Y electrode driving circuit board, a power supplying board, a logic control board, etc., may be disposed on a rear portion of the chassis. Accordingly, because numerous circuit boards may be disposed on the rear portion of the chassis, there may be limitations when mounting the circuit boards onto the chassis, e.g., restrictive space size. In addition, because the circuit boards may be closely arranged, electromagnetic waves generated by the circuit boards may not be shielded effectively.

SUMMARY OF THE INVENTION

Example embodiments are therefore directed to a coupling structure of a chassis base and circuit boards, and a display apparatus including the same, which substantially overcome one or more of the problems due to the limitations and disadvantages of the related art.

It is therefore a feature of an example embodiment to provide a coupling structure of a chassis base and circuit boards so that electromagnetic waves generated by the circuit boards may be shielded and/or reduced.

It is therefore another feature of an example embodiment to improve the mounting method of the circuit boards.

At least one of the above and other features of example embodiments may be realized by providing a coupling structure including a chassis base configured to support a display panel, and an electromagnetic wave shielding member connected to the chassis base so as to form an area for installing a circuit board. The electromagnetic wave shielding member may surround the circuit board.

The electromagnetic wave shielding member may be connected to the chassis base using a plurality of first bosses and a plurality of first coupling members inserted into each of the first bosses. The circuit board may be connected to the electromagnetic wave shielding member using a plurality of second bosses and a plurality of second coupling members inserted into each of the second bosses.

The electromagnetic wave shielding member may be directly connected to the chassis base.

The electromagnetic wave shielding member may include a major shielding portion in parallel with the chassis base, a side shielding portion extending from an end of the major shielding portion toward the chassis base, and a coupling portion extending from an end of the side shielding portion in a direction parallel to the chassis base. The coupling portion and the chassis base may be connected to each other using a boss and a coupling member. The circuit board may be installed on a surface of the major shielding portion that faces the chassis base. The circuit board may also be installed on the chassis base.

The chassis base may be connected to the electromagnetic wave shielding member using a hinge. The hinge may be used on one side to connect the chassis base and the electromagnetic wave shielding member, and a coupling member may be used on an opposite side to connect the chassis base and the electromagnetic wave shielding member.

At least one of the above and other features of example embodiments may also be realized by providing a display apparatus, including a display panel, a chassis base disposed on a rear portion of the display panel to support the display panel, and an electromagnetic wave shielding member connected to the chassis base to form an area for installing a circuit board. The electromagnetic wave shielding member may surround the circuit board.

In yet another feature of example embodiments, the display panel may be a plasma display panel.

BRIEF DESCRIPTION OF THE DRAWINGS

The above and other features and advantages of the example embodiments will become more apparent to those of ordinary skill in the art by describing the example embodiments in detail with reference to the attached drawings, in which.

DETAILED DESCRIPTION OF THE INVENTION

Korean Patent Application No. 10-2007-0021156, filed on Mar. 2, 2007, in the Korean Intellectual Property Office, and entitled: "Coupling Structure of Chassis Base and Circuit Board and Display Apparatus Including the Same," is incorporated by reference herein in its entirety.

Example embodiments will now be described more fully hereinafter with reference to the accompanying drawings. Example embodiments may, however, be embodied in different forms and should not be construed as limited to the embodiments set forth herein. Rather, these example embodiments are provided so that this disclosure will be thorough and complete, and will fully convey the scope of the invention to those skilled in the art.

Example embodiments provide circuit boards being surrounded by an electromagnetic wave shielding member so as to shield against electromagnetic waves generated by the circuit boards and protect from external shocks. Further, since the circuit boards are coupled to the electromagnetic wave shielding member and the electromagnetic wave shielding member are coupled to the chassis base, assembly of the display apparatus may be improved.

Figure 1A:
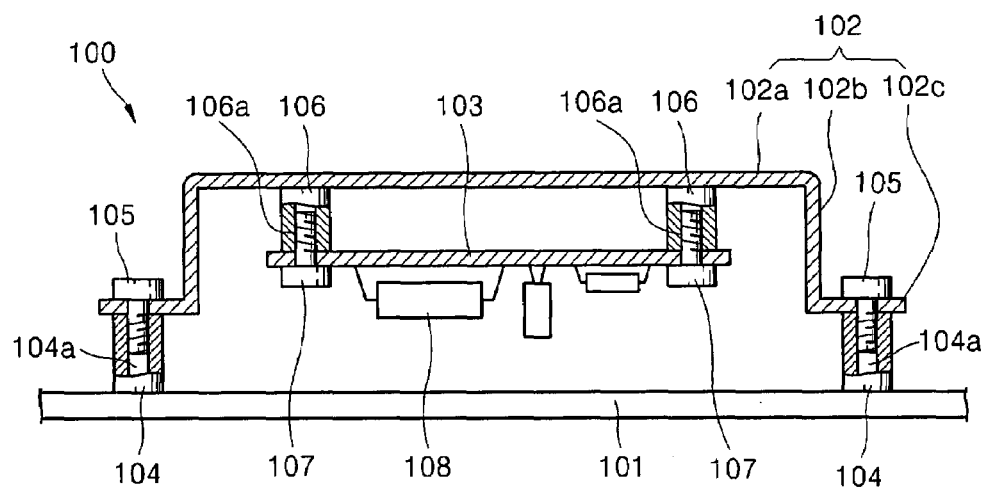
FIGS. 1A and 1B illustrate cross-sectional views of a coupling structure of a chassis base and a circuit board according to example embodiments.

FIG. 1A illustrates a cross-sectional view of a coupling structure between a chassis base and circuit boards according to an example embodiment.

Referring to FIG. 1A, a coupling structure 100 may include a chassis base 101, at least one first boss 104, at least one first coupling member 105, an electromagnetic wave shielding member 102, at least one circuit board 103, at least one second boss 106, and at least one second coupling member 107.

The chassis base 101 may support a PDP (not shown), and may be fabricated using a casting method or a pressing method, for example. It should be appreciated that the chassis base 101 may support other display panels besides PDPs. The chassis base 101 may be formed of a metal, for example, having a high thermal conductivity and a high rigidity in order to externally dissipate heat transferred from the PDP. In alternative example embodiments, the chassis base 101 may be formed of a material, such as plastic, that may not be conductive and that may be light and rigid. It should be appreciated that other materials may be employed to fabricate the chassis base 101.

A plurality of first bosses 104 may be formed on the chassis base 101. Each of the first bosses 104 may have a hole 104a on an upper portion thereof, and a screw tap on an inner circumferential surface of the hole 104a so as to be coupled to the electromagnetic wave shielding member 102 using the first coupling member 105. In an example embodiment, the first coupling member 105 may be a bolt having a screw tap on an outer circumferential surface thereof so as to correspond with the screw tap on the inner circumferential surface of the hole 104a. However, it should be appreciated that the electromagnetic wave shielding member 102 and the chassis base 101 may be coupled to each other using other coupling means. For example, the inner circumferential surface of the hole 104a in the first boss 104 may be smooth, and the coupling member may be a pin inserted therein.

The first bosses 104 may be integrally formed with the chassis base 101. Otherwise, the first bosses 104 may be formed separately from the chassis base 101, and may be coupled to the chassis base 101 using an indentation method, for example. It should further be appreciated that other methods may be employed to form the first bosses 104 with the chassis base 101.

Figure 1B:
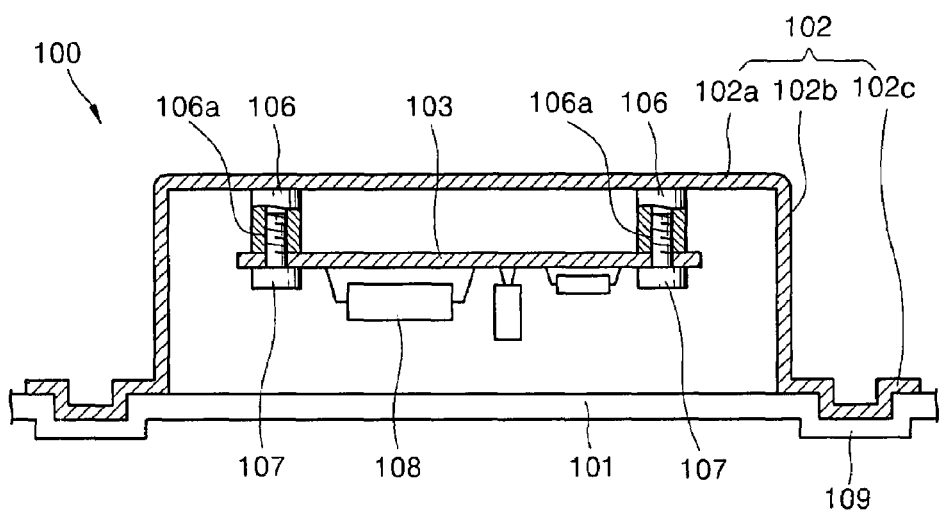

The electromagnetic wave shielding member 102 may be coupled to the chassis base 101 to form an area, i.e., a mounting space, where the circuit board 103 may be mounted. As shown in FIG. 1A, the electromagnetic wave shielding member 102 may be coupled to the chassis base 101 using the first bosses 104 and the first coupling members 105. It should further be appreciated that the electromagnetic wave shielding member 102 may be coupled to the chassis base 101 using a coupling member such as a bolt through a penetration hole formed in the chassis base 101 and the electromagnetic wave shielding member 102, without forming the first bosses 104. In alternative example embodiments, as illustrated, for example, in FIG. 1B, the electromagnetic wave shielding member 102 and the chassis base 101 may be coupled to each other using, for example, but not limited to, a TOX® process, e.g., without using coupling members such as bolts and/or pins. In the TOX® method, a mold having a groove with a certain shape and a certain size is disposed on one surface of a pair of thin plates facing each other, and then a rod with a certain size is pushed from the other surface of the thin plate pair into the groove of the mold, thereby attaching the thin plates to each other.

Referring to FIG. 1A, the electromagnetic wave shielding member 102 may include a major (e.g., horizontal) shielding portion 102a, to which the circuit board 103 may be mounted, a side shielding portion 102b extending from an end portion of the major shielding portion 102a, and a coupling portion 102c extending from an end portion of the side shielding portion 102b in parallel to the chassis base 101 and coupled to the chassis base 101. The major shielding portion 102a may be formed parallel to the chassis base 101. Thus, the circuit board 103 may be mounted on a lower surface of the horizontal shielding portion 102a that may face the chassis base 101, e.g., in the space formed between the electromagnetic wave shielding member 102 and the chassis base 101. However, it should be appreciated that the circuit board 103 may be mounted at other locations of the coupling structure.

The circuit board 103 on the lower surface of the horizontal shielding portion 102a may be coupled to the second bosses 106 using the second coupling members 107. As shown in FIG. 1A, the second bosses 106 may be formed on the lower surface of the horizontal shielding portion 102a. The second bosses 106 may be integrally formed with the electromagnetic wave shielding member 102. In another example embodiment, the second bosses 106 may be formed separately from the electromagnetic wave shielding member 102 and then coupled to the electromagnetic wave shielding member 102 using, e.g., an indentation method. However, it should be appreciated that other methods may be employed to form the second bosses 106 to the electromagnetic wave shielding member 102.

A screw tap 106a may be formed on an inner circumferential surface of each of the second bosses 106, and a penetration hole corresponding to the screw tap 106a may be formed in the circuit board 103. Therefore, the circuit board 103 may be coupled to the electromagnetic wave shielding member 102 using the second coupling member 107. In an example embodiment, the second coupling member 107 may be a bolt having a screw tap on an outer circumferential surface thereof, which may correspond with the inner circumferential surface of the second bosses 106. However, it should be appreciated that other coupling members, such as, but not limited to, pins, may couple the circuit board 103 to the electromagnetic wave shielding member 102.

The side shielding portion 102b of the electromagnetic wave shielding member 102 may extend from an end of the horizontal shielding portion 102a toward the chassis base 101, e.g., the side shielding portion 102b may be substantially vertically aligned between the horizontal shielding portion 102a and the coupling portion 102c. In other words, the horizontal shielding portion 102a may be formed so as to surround the circuit board 103, and form a right angle with respect to the side shielding portion 102b. However, it should be appreciated that the angle between the horizontal shielding portion 102a and the side shielding portion 102b may be other angles besides a right angle.

The coupling portion 102c of the electromagnetic wave shielding member 102 may be formed by extending an end portion of the side shielding portion 102b in a direction that may be parallel to the chassis base 101, and may be coupled to the chassis base 101. The coupling portion 102c and the chassis base 101 may be coupled to each other using the first bosses 104 and the first coupling members 105, for example. That is, the hole 104a may be formed in the upper portion of the first boss 104, the screw tap may be formed on the inner circumferential surface of the hole, and the penetration hole formed in the coupling portion 102c may correspond to the hole 104a of the first boss 104. Therefore, the first coupling member 105 may be coupled to the penetration hole of the coupling portion 102c and to the screw tap of the first boss 104 so as to couple the electromagnetic wave shielding member 102 to the chassis base 101. However, it should be appreciated that other configurations may be employed. For example, a penetration hole may be formed in the chassis base 101 without forming the first boss 104, such that the penetration hole of the chassis base 101 and the penetration hole of the coupling portion 102c may be coupled to each other using a coupling member, e.g., a bolt, to install the electromagnetic shielding member 102 onto the chassis base 101. In addition, instead of forming the penetration holes in the chassis base 101 and the coupling portion 102c of the electromagnetic wave shielding member 102, the chassis base 101 and the coupling portion 102c may be coupled to each other using, for example, but not limited to, a TOX® process.

In this example embodiment, the circuit board 103 may be mounted on the lower surface of the horizontal shielding portion 102a of the electromagnetic wave shielding member 102, which may be surrounded by the side shielding portion 102b of the electromagnetic wave shielding member 102 and the chassis base 101. Therefore, electromagnetic waves generating from electronic elements 108 mounted on the circuit board 103 may be effectively shielded.

Further, because the circuit board 103 and the electromagnetic wave shielding member 102 may be coupled to the chassis base 101 after the installation of each circuit board 103 on the electromagnetic wave shielding member 102, the assembling efficiency of the display apparatus may be improved as compared to when the circuit board 103 is directly coupled to the chassis base 101.

The circuit board 103 may include various electronic elements 108 for driving the PDP, and may supply electric signals for driving the PDP. It should be appreciated that the circuit board 103 may include other elements and/or devices. The circuit boards 103 used in the plasma display apparatus may be, for example, but not limited to, an address electrode driving circuit board, an X electrode driving circuit board and a Y electrode driving circuit board, a power supplying board, and a logic control board. The address electrode driving circuit board may supply voltage to the address electrodes, and the X and Y electrode driving circuit boards may supply voltages to X and Y electrodes, respectively. The power supplying board may use a switching mode power supply (SMPS) to reduce power sizes and improve efficiency. The logic control board may perform calculations and provide controls required to drive the PDP.

In an example embodiment, all of the circuit boards 103 may be surrounded by the electromagnetic shielding member 102. However, in another example embodiment, only some of the circuit boards 103 may be selectively surrounded by the electromagnetic wave shielding member 102. For example, the electromagnetic wave shielding member 102 may surround only the logic control board, as the logic control board may generate sufficient amount of electromagnetic waves.

The circuit board 103 may transmit electric signals to the PDP through signal transmission members (not shown). The signal transmission members may be flexible circuit connectors such as, but not limited to, tape carrier packages (TCPs) or chip-on-films (COFs). The electromagnetic wave shielding member 102 may include penetration holes for electrically connecting the circuit board 103 to the PDP using the signal transmission members. For example, the penetration hole may be formed in the side shielding portion 102b of the electromagnetic wave shielding member 102 to connect the circuit board 103 to the PDP.

Figure 2:
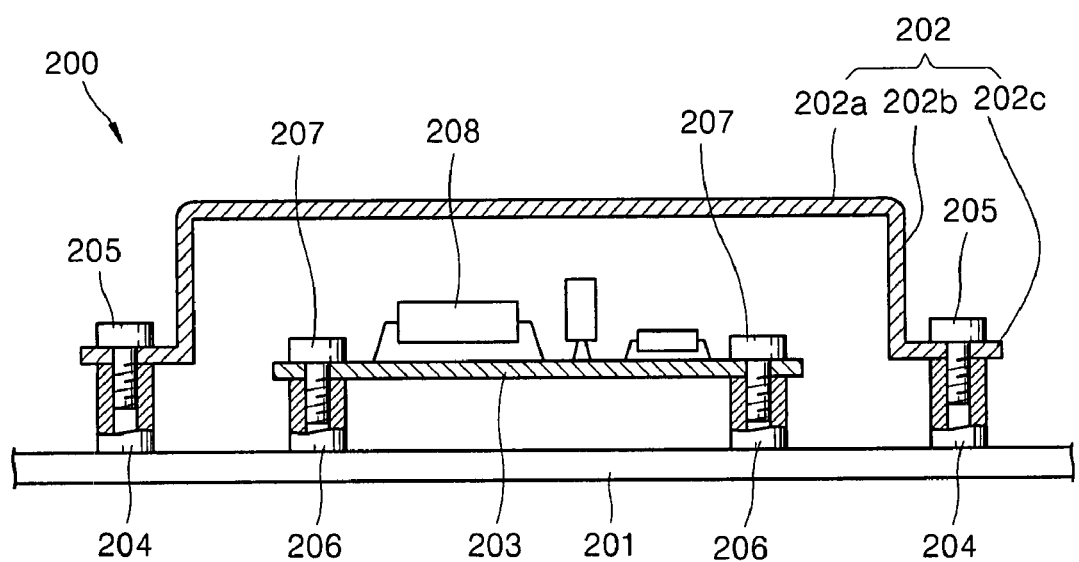
FIG. 2 illustrates a cross-sectional view of a coupling structure of a chassis base and a circuit board according to another example embodiment.

FIG. 2 illustrates a cross-sectional view of a coupling structure 200 of a chassis base 201 and a circuit board 203 according to another example embodiment. The coupling structure 200 of the chassis base 201 and the circuit board 203 of FIG. 2 may be similar to the coupling structure 100 of FIG. 1A, except for the location of the circuit board 203, e.g., the circuit board 203 may be formed on the chassis base 201 rather than being formed on a lower surface of the electromagnetic wave shielding member 202.

The circuit board 203 formed on the chassis base 201 may be covered by an electromagnetic wave shielding member 202. The electromagnetic wave shielding member 202 may be coupled to the chassis base 201 using first coupling members 205, which may be connected to first bosses 204 formed on the chassis base 201 to penetration holes formed in a coupling portion of the electromagnetic wave shielding member 202. As similarly discussed above, the electromagnetic wave shielding member 202 may be coupled to the chassis base 102 using other coupling methods, for example, but not limited to, a TOX® process.

Figure 3:
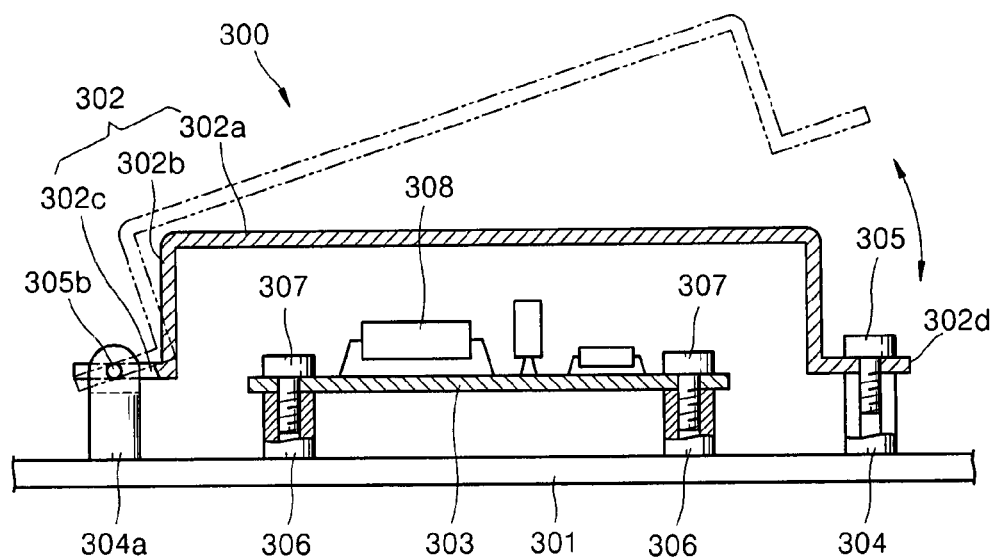
FIG. 3 illustrates a cross-sectional view of a coupling structure of a chassis base and a circuit board according to another example embodiment.

FIG. 3 illustrates a cross-sectional view of a coupling structure 300 of a chassis base 301 and a circuit board 303 according to another example embodiment. The coupling structure 300 of the chassis base 301 and the circuit board 303 of FIG. 3 may be similar from the coupling structure of FIG. 2, except for the coupling feature of an electromagnetic wave shielding member 302 and the chassis base 301.

Referring to FIG. 3, the electromagnetic wave shielding member 302 and the chassis base 301 may be coupled to each other using a hinge, for example. The hinge may be a hinge knuckle formed on an upper portion of a protrusion 304a formed on the chassis base 301, and a coupling hole may be formed on a coupling portion 302c of the electromagnetic wave shielding member 302. The hinge knuckle and the coupling hole may be coupled to each other using a hinge pin 305b, and thus, the electromagnetic wave shielding member 302 may be lifted from the chassis base 301 about the hinge.

Further, a coupling portion 302d opposite to the coupling portion 302c, in which a coupling hole may be formed, may be coupled to a first boss 304 formed on the chassis base 301 using a first coupling member 305. As described above, a side of the electromagnetic wave shielding member 302 may be coupled to the chassis base 301 using the hinge and the other side of the electromagnetic wave shielding member 302 may be coupled to the chassis base 301 using the coupling member, e.g., the first coupling member 305. Therefore, when the circuit board 303 needs to be repaired, the electromagnetic wave shielding member 302 may be opened by separating one coupling member, e.g., the first coupling member 305. As a result, the repair of the circuit board 303 may be easily and efficiently performed.

Figure 4:
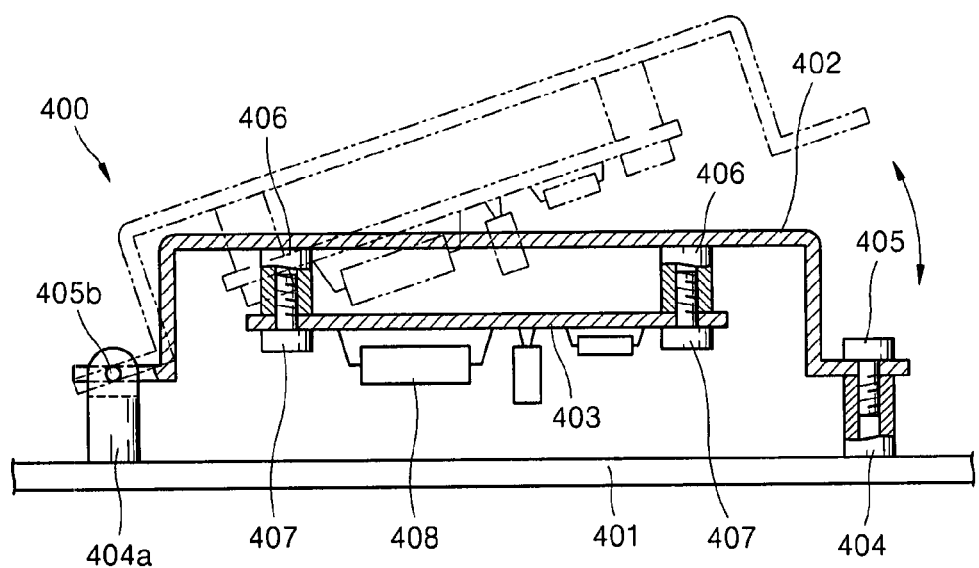
FIG. 4 illustrates a cross-sectional view of a coupling structure of a chassis base and a circuit board according to another example embodiment.

FIG. 4 illustrates a cross-sectional view of a coupling structure 400 of a chassis base 401 and a circuit board 403 according to another example embodiment. The coupling structure 400 of the chassis base 401 and the circuit board 403 in FIG. 4 may be similar to the coupling structure of the example embodiment shown in FIG. 3, except for the location of the circuit board 403, e.g., the circuit board 403 may be formed on a lower surface of an electromagnetic wave shielding member 402 that may face the chassis base 401, rather than the circuit board 303 being formed on the chassis base 301 as shown in FIG. 3.

Further, the coupling structure of FIG. 4 may be similar to the coupling structure 100 of FIG. 1A, in that the circuit board 403 may be installed on the lower surface of the electromagnetic wave shielding member 402, and one side of the electromagnetic wave shielding layer 402 may be coupled to the chassis base 401 using a hinge, for example.

Figure 5:
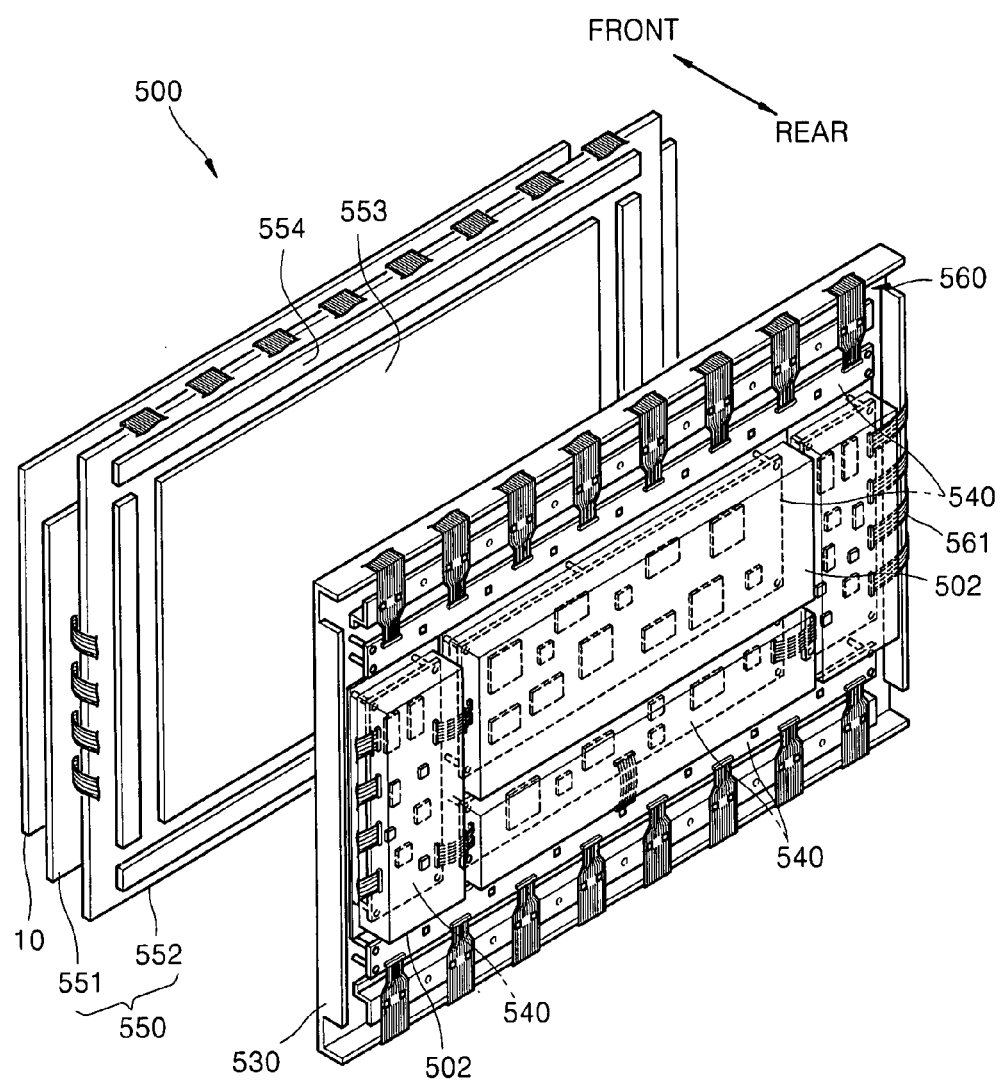
FIG. 5 illustrates a perspective view of a plasma display apparatus including a coupling structure of a chassis base and circuit boards according to an example embodiment.

FIG. 5 illustrates a perspective view of a plasma display apparatus 500 including a coupling structure of a chassis base 530 and a circuit board 540 according to an example embodiment.

Referring to FIG. 5, the plasma display apparatus 500 may include a PDP 550, a chassis base 530, and a plurality of circuit units 540. A filter 10, e.g., a contrast enhancing film (CEF), may be attached on a front surface of the PDP 550. The PDP 550 and the chassis base 530 may be coupled to each other using an adhesive part 554, e.g., a dual-adhesive tape. A thermal conductive member 553 may be disposed between the chassis 530 and the PDP 550 in order to dissipate the heat emitted from the PDP 550 via the chassis base 530.

The PDP 550 may display images using a gas discharge, for example. The PDP 550 may include a front substrate 551 and a rear substrate 552 coupled to each other. Discharge cells, which may be partitioned by barrier ribs (not shown), may be formed between the front and rear substrates 551 and 552, and a discharge gas may be filled in the discharge cells. In addition, a phosphor material may be applied in the discharge cells.

A plurality of address electrodes (not shown) may be disposed parallel to each other on the rear substrate 552, and sustain electrode in pairs (not shown) may be disposed in a direction crossing the address electrodes on the front substrate 551. When a discharge occurs in the discharge gas between the electrodes due to the voltages applied to the electrodes, the phosphor material may be excited by ultraviolet rays due to the discharge of the discharge gas which may emit light and display images.

The chassis base 530 may be disposed on a rear portion of the PDP 550 in order to structurally support the PDP 550. The chassis base 530 may be formed of a metal having a high rigidity, for example, but not limited to, aluminum, steel, and/or a plastic material.

The thermal conductive member 553 may be disposed between the PDP 550 and the chassis base 530. Further, a plurality of strips of dual-adhesive tape 554 may be disposed on portions of the rear substrate 552 along an edge of the thermal conductive member 553. The plurality of strips of dual-adhesive tape 554 may attach the PDP 550 and the chassis base 530 to each other. It should be appreciated that other attachment elements may be employed.

The plurality of circuit units 540 may be disposed on the rear portion of the chassis base 530, which may include circuits for driving the PDP 550. The circuit boards 540 may transmit electric signals to the PDP 550 using signal transmission members, for example. Flexible printed cables (FPCs), TCPs, and/or COFs may be used as the signal transmission members. In an example embodiment, FPCs 561 may be disposed on left and right sides of the chassis 530 as signal transmission members, and TCPs 560 may be disposed on upper and lower portions of the chassis 530 as signal transmission members.

As shown in FIG. 5, electromagnetic wave shielding members 502 may be disposed so as to surround each of the circuit boards 540 disposed on the rear portion of the chassis 530. Because the electromagnetic wave shielding members 502 may surround each of the circuit boards 540, the electromagnetic waves generated by the electronic elements mounted on the circuit boards 540 may be shielded effectively, and may protect the circuit boards 540 from external shocks.

The circuit boards 540 may be disposed on the rear portion of the chassis base 530 and/or may be disposed on a lower surface of the electromagnetic wave shielding members 502 that faces the chassis 530.

Although some example embodiments describe the coupling structure of the chassis base and the circuit board applied to a plasma display apparatus, it should be appreciated that the coupling structure may also be applied to other display apparatuses.

In the figures, the dimensions of layers and regions may be exaggerated for clarity of illustration. It will also be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Further, it will be understood that when a layer is referred to as being "under" or "above" another layer, it can be directly under or directly above, and one or more intervening layers may also be present. In addition, it will also be understood that when a layer is referred to as being "between" two layers, it can be the only layer between the two layers, or one or more intervening layers may also be present. Like numbers refer to like elements throughout. As used herein, the term "and/or" includes any and all combinations of one or more of the associated listed items.

It will also be understood that, although the terms "first" and "second," etc. may be used herein to describe various elements, structures, components, regions, layers and/or sections, these elements, structures, components, regions, layers and/or sections should not be limited by these terms. These terms are only used to distinguish one element, structure, component, region, layer and/or section from another element, structure, component, region, layer and/or section. Thus, a first element, structure, component, region, layer or section discussed above could be termed a second element, structure, component, region, layer or section without departing from the teachings of example embodiments.

Spatially relative terms, such as "beneath," "below," "lower," "above," "upper" and the like, may be used herein for ease of description to describe one element or feature relationship to another element(s) or feature(s) as illustrated in the figures. It will be understood that the spatially relative terms are intended to encompass different orientations of the device in use or operation in addition to the orientation depicted in the figures. For example, if the device in the figures is turned over (or upside down), elements or layers described as "below" or "beneath" other elements or layers would then be oriented "above" the other elements or layers. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit the example embodiments. As used herein, the singular forms "a," "an" and "the" are intended to include the plural forms as well, unless the context clearly indicates otherwise.

Example embodiments are described herein with reference to cross-sectional illustrations that are schematic illustrations of idealized embodiments and/or intermediate structures. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed:

1. A coupling structure, comprising:
   a chassis base configured to support a display panel; and
   an electromagnetic wave shielding member connected to the chassis base so as to form an area for installing a circuit board, the electromagnetic wave shielding member surrounding the circuit board, and the electromagnetic wave shielding member including:
      a major shielding portion, the circuit board being between the major shielding portion and the chassis base, and
      a coupling portion extending in a direction parallel to the chassis base, the coupling portion connecting the major shielding portion to the chassis base.

2. The coupling structure as claimed in claim 1, wherein the electromagnetic wave shielding member is connected to the chassis base using a plurality of first bosses and a plurality of first coupling members inserted into the first bosses, and the circuit board is connected to the electromagnetic wave shielding member using a plurality of second bosses and a plurality of second coupling members inserted into the second bosses.

3. The coupling structure as claimed in claim 1, wherein the electromagnetic wave shielding member is directly connected to the chassis base.

4. The coupling structure as claimed in claim 1, wherein the electromagnetic wave shielding member comprises:
   the major shielding portion in parallel with the chassis base, the major shielding portion being spaced apart from the chassis base;
   a side shielding portion extending from an end of the major shielding portion toward the chassis base; and
   the coupling portion extending from an end of the side shielding portion in a direction parallel to the major shielding portion, the side shielding portion being between the major shielding portion and the coupling portion.

5. The coupling structure as claimed in claim 1, wherein the coupling portion and the chassis base are connected to each other using a boss and a coupling member.

6. The coupling structure as claimed in claim 1, wherein the circuit board is installed on a surface of the major shielding portion that faces the chassis base.

7. The coupling structure as claimed in claim 1, wherein the circuit board is installed on the chassis base.

8. The coupling structure as claimed in claim 1, wherein the chassis base is connected to the electromagnetic wave shielding member using a hinge.

9. The coupling structure as claimed in claim 8, wherein the hinge is used on one side to connect the chassis base and the electromagnetic wave shielding member, and a coupling member is used on an opposite side to connect the chassis base and the electromagnetic wave shielding member.

10. The coupling structure as claimed in claim 1, wherein the coupling portion of the electromagnetic wave shielding member extends from the major shielding portion and is directed away from the circuit board to a predetermined length, the entire predetermined length being on the chassis base.

11. A display apparatus, comprising:
    a display panel;
    a chassis base disposed on a rear portion of the display panel to support the display panel; and
    an electromagnetic wave shielding member connected to the chassis base so as to form an area for installing a circuit board, the electromagnetic wave shielding member surrounding the circuit board, and the electromagnetic wave shielding member including:
       a major shielding portion, the circuit board being between the major shielding portion and the chassis base, and
       a coupling portion extending in a direction parallel to the chassis base, the coupling portion connecting the major shielding portion to the chassis base.

12. The display apparatus as claimed in claim 11, wherein the electromagnetic wave shielding member is connected to the chassis base using a plurality of first bosses and a plurality of first coupling members inserted into the first bosses, and the circuit board is connected to the electromagnetic wave shielding member using a plurality of second bosses and a plurality of second coupling members inserted into the second bosses.

13. The display apparatus as claimed in claim 11, wherein the electromagnetic wave shielding member is directly connected to the chassis base.

14. The display apparatus as claimed in claim 11, wherein the electromagnetic wave shielding member comprises:
    the major shielding portion in parallel with the chassis base, the major shielding portion being spaced apart from the chassis base;
    a side shielding portion extending from an end of the major shielding portion toward the chassis base; and
    the coupling portion extending from an end of the side shielding portion in a direction parallel to the major shielding portion, the side shielding portion being between the major shielding portion and the coupling portion.

15. The display apparatus as claimed in claim 11, wherein the coupling portion and the chassis base are connected to each other using a boss and a coupling member.

16. The display apparatus as claimed in claim 11, wherein the circuit board is installed on a surface of the major shielding portion that faces the chassis base.

17. The display apparatus as claimed in claim 11, wherein the circuit board is installed on the chassis base.

18. The display apparatus as claimed in claim 11, wherein the chassis base is connected to the electromagnetic wave shielding member using a hinge.

19. The display apparatus as claimed in claim 18, wherein the hinge is used on one side to connect the chassis base and the electromagnetic wave shielding member, and a coupling member is used on an opposite side to connect the chassis base and the electromagnetic wave shielding member.

20. The display apparatus as claimed in claim 11, wherein the display panel is a plasma display panel.

* * * * *